United States Patent
Liu et al.

(10) Patent No.: US 8,686,766 B2
(45) Date of Patent: Apr. 1, 2014

(54) READ OUT INTEGRATED CIRCUIT

(71) Applicant: Raytheon Company, Waltham, MA (US)

(72) Inventors: Kanon Liu, Arcadia, CA (US); Bryan W. Kean, Denver, CO (US); James F. Asbrock, Oceanside, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/764,483

(22) Filed: Feb. 11, 2013

(65) Prior Publication Data

US 2014/0062602 A1 Mar. 6, 2014

Related U.S. Application Data

(62) Division of application No. 12/619,870, filed on Nov. 17, 2009, now Pat. No. 8,373,458.

(51) Int. Cl.
*H03L 7/00* (2006.01)

(52) U.S. Cl.
USPC .................................................. 327/142

(58) Field of Classification Search
USPC ........................... 327/142, 143, 198
See application file for complete search history.

(56) References Cited

U.S. PATENT DOCUMENTS

2007/0075751 A1* 4/2007 Furuya et al. ............ 327/112

* cited by examiner

*Primary Examiner* — Daniel Rojas

(57) ABSTRACT

According to one embodiment, a circuit comprises a Capacitive Trans-Impedance Amplifier (CTIA) configured to receive a current pulse at an input and convert the current pulse to a voltage step. The voltage step is directed to a first signal path and a second signal path. When the voltage step exceeds a first threshold, the first signal path directs an enable pulse to the second signal path. The second signal path generates an output pulse when the voltage step exceeds a second threshold and the enable pulse is enabled. The second signal path comprises a first, a second, and a third amplifier to increase detection of the voltage step by the second signal path.

10 Claims, 5 Drawing Sheets

READ OUT INTEGRATED CIRCUIT

CROSS-REFERENCE TO RELATED APPLICATIONS

This application is a divisional of U.S. patent application Ser. No. 12/619,870, filed Nov. 17, 2009, entitled "READ OUT INTEGRATED CIRCUIT This application hereby claims the benefit and/or priority each of said respective application Ser. No. 12/619,870 and hereby incorporates them by reference as if fully set forth herein.

GOVERNMENT FUNDING

The U.S. Government may have certain rights in this invention as provided for by the terms of Contract No. FA8632-05-C-2454 awarded by the (AFRL) Air Force Research Lab, (MDA) Missile Defense Agency at Kirkland AFB in Albuquerque, N. Mex.

TECHNICAL FIELD

This invention relates generally to the field of integrated circuits and more specifically to a read out integrated circuit.

BACKGROUND

A Read Out Integrated Circuit (ROIC) may receive sensor data from a sensor, transform the sensor data, and transmit the transformed data to external electronics. As an example, the ROIC may be configured in a Laser Detection and Ranging (LADAR) system operable to track a target object using laser signals. The ROIC may receive an analog current pulse describing a location of the target object, transform the analog current pulse to a digital voltage pulse, and transmit the digital voltage pulse to a display.

SUMMARY OF THE DISCLOSURE

According to one embodiment, a circuit comprises a Capacitive Trans-Impedance Amplifier (CTIA) configured to receive a current pulse at an input and convert the current pulse to a voltage step. The voltage step is directed to a first signal path and a second signal path. When the voltage step exceeds a first threshold, the first signal path directs an enable pulse to the second signal path. The second signal path generates an output pulse when the voltage step exceeds a second threshold and the enable pulse is enabled. The second signal path comprises a first, a second, and a third amplifier to increase detection of the voltage step by the second signal path.

According to one embodiment, a circuit comprises a Resistive Trans-Impedance Amplifier (RTIA) configured to receive a current pulse at an input and convert the current pulse to a voltage pulse. The voltage pulse is directed to a first signal path and a second signal path. When the voltage pulse exceeds a first threshold, the first signal path directs an enable pulse to the second signal path. The second signal path generates an output pulse when the voltage pulse exceeds a second threshold and the enable pulse is enabled. The second signal path comprises a first and a second high pass amplifier to increase detection of the voltage pulse by the second signal path.

Some embodiments of the disclosure may provide one or more technical advantages. In some embodiments, an output signal may be generated when an input signal and an enable signal are detected at substantially the same time. In some embodiments, amplifiers may sharpen a waveform of the input signal, which may improve synchronization with the enable pulse. In this manner, the output signal may be generated more accurately.

Some embodiments may benefit from some, none, or all of these advantages. Other technical advantages may be readily ascertained by one of ordinary skill in the art.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Embodiments of the present invention and its advantages are best understood by referring to FIGS. 1-7 of the drawings, like numerals being used for like and corresponding parts of the various drawings.

Figure 1:
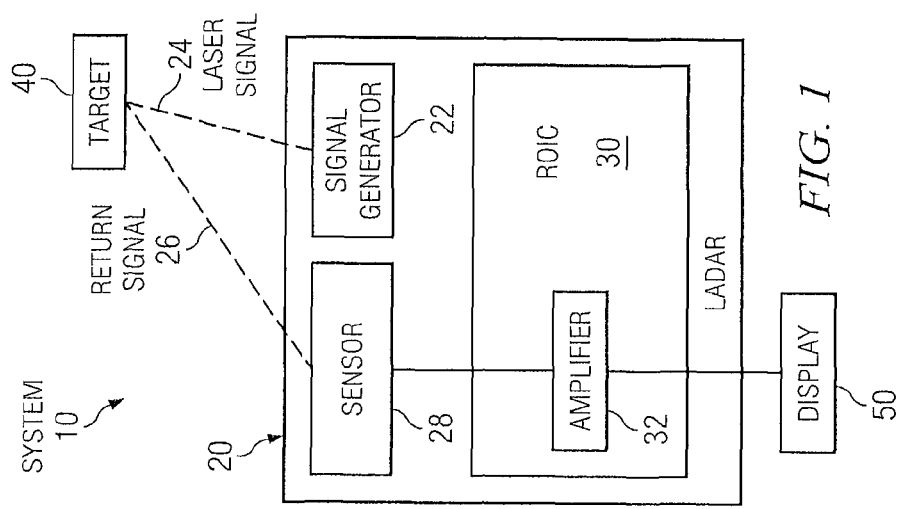
FIG. 1 illustrates an example of a Laser Detection and Ranging (LADAR) system comprising a high-pass amplifier.

FIG. 1 illustrates an example of a Laser Detection and Ranging (LADAR) system 10. In some embodiments, system 10 may comprise a LADAR 20 configured to detect a target object 40. For example, the LADAR 20 may transmit a laser signal 24 that may impinge on a surface of the target object 40 and may be reflected back toward the LADAR 20 as a return signal 26. In some embodiments, the LADAR 20 may determine a three-dimensional location of the target object 40 according to the angle at which the return signal 26 is received and/or the amount of delay in receiving the return signal 26.

In some embodiments, the LADAR 20 may comprise a signal generator 22, a sensor 28, and a Read Out Integrated Circuit (ROIC) 30. The signal generator 22 may generate any suitable laser signal 24, such as an infrared laser pulse. The laser signal 24 may be transmitted according to a scan pattern that traverses a two-dimensional area. In some embodiments, the laser signal 24 may impinge on a surface of the target object 40 and may be reflected back toward the LADAR 20.

The sensor 28 of LADAR 20 may detect the return signal 26. In some embodiments, sensor 28 may comprise a focal-plane array of light-sensing pixels. The focal-plane array may detect photons of a particular wavelengths, such as infrared wavelengths, and may generate an analog current pulse according to the number of photons detected at each pixel.

In some embodiments, the analog current pulse may be transmitted from the sensor 28 to the ROIC 30. The ROIC 30 may comprise an amplifier system 32 for transforming the analog current pulse to a digital voltage pulse. The digital voltage pulse may be transmitted from the ROIC 30 to other equipment, such as a display 50 configured to provide a user with information describing a three-dimensional location of the target object 40.

Modifications, additions, or omissions may be made to the system described without departing from the scope of the invention. The system may include more fewer, or other components. Additionally, components may be integrated or separated. For example, in some embodiments the signal generator 22 may be external to the LADAR 20. As another example, in some embodiment the display 50 may be located within the LADAR 20.

Figure 2:
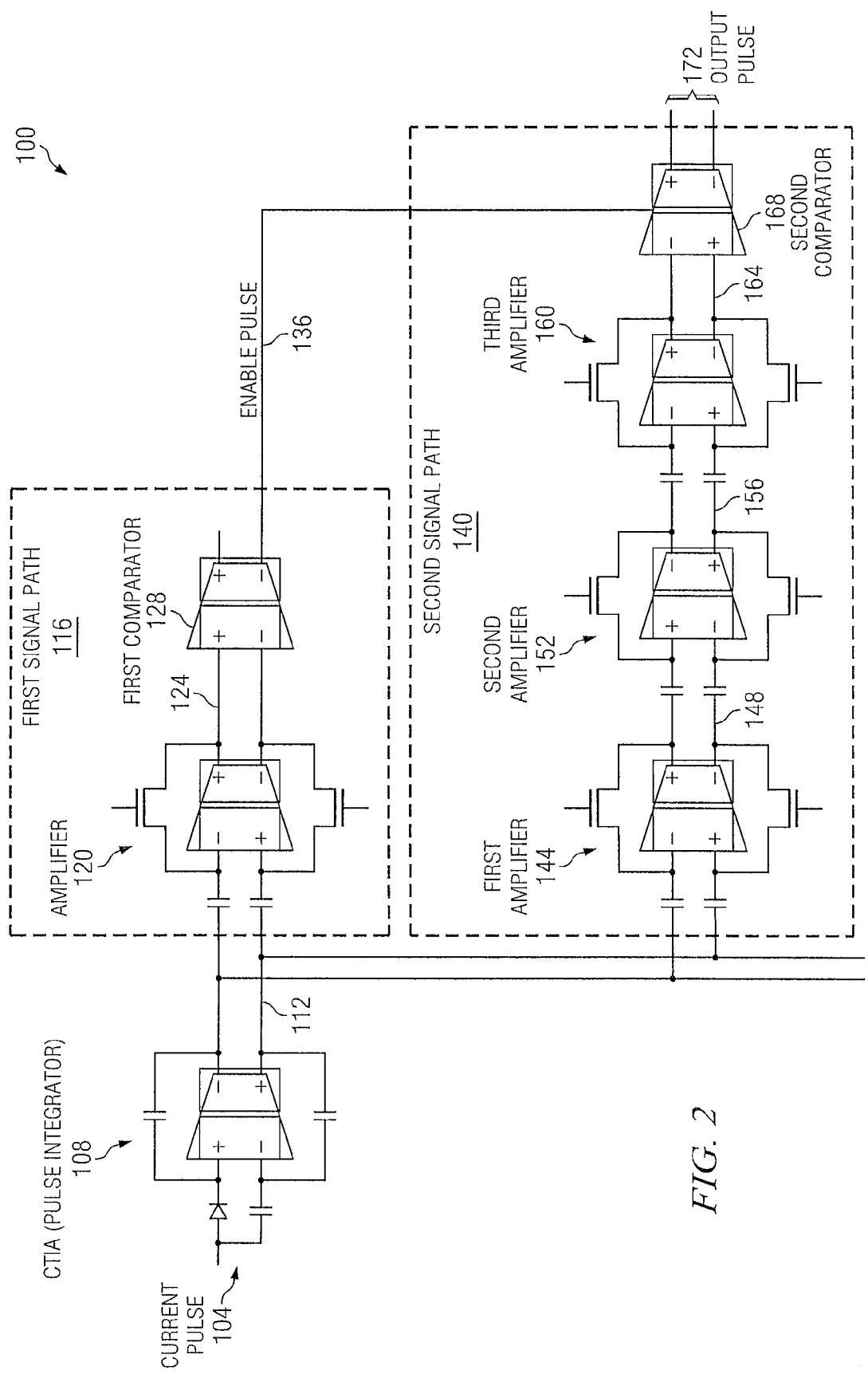
FIG. 2 illustrates an example of a circuit comprising a Capacitive Trans-Impedance Amplifier (CTIA) and a high-pass amplifier.

FIG. 2 illustrates an example of a circuit 100 comprising a Capacitive Trans-Impedance Amplifier (CTIA) pulse integrator 108 and a high-pass amplifier.

In some embodiments, the circuit 100 may be used as the amplifier system 32 of FIG. 1.

In some embodiments, circuit 100 may receive an analog current pulse 104, such as a current pulse 104 generated by a sensor of a LADAR. The current pulse 104 may be received by the CTIA pulse integrator 108, where it may be converted to a voltage step 112. The voltage step 112 may be directed to a first signal path 116 and a second signal path 140.

In some embodiments, the first signal path 116 may generate an enable pulse 136 configured to enable the second signal path 140 to generate an output pulse 172. The first signal path 116 may comprise a low-noise, high-pass amplifier 120 and a first path comparator 128. In some embodiments, the amplifier 120 may filter the voltage step 112 to yield a filtered voltage pulse 124. For example, the amplifier 120 may allow a signal comprising higher frequencies to pass and may filter out noise comprising lower frequencies.

In some embodiments, the filtered voltage pulse 124 may be directed to the first path comparator 128. The first path comparator 124 may enable the enable pulse 136 when the filtered voltage pulse 124 exceeds a first threshold 132. The first signal path 116 may be configured to minimize detection of a false pulse. As an example, the first threshold 132 may be relatively high, such as a threshold in the range of 50 mV to 500 mV (referred to the output 124 of the high-pass amplifier 120). As another example, the bandwidth of the amplifier 120 may be relatively small to filter out the relatively low frequencies.

The bandwidth of the amplifier 120 may be characterized by a roll-on frequency and a roll-off frequency. The roll-on frequency may be a frequency below which the signal is attenuated. In some embodiments, the attenuation may be incremental such that frequencies slightly lower than the roll-on frequency are less attenuated than frequencies significantly lower than the roll-on frequency. The roll-off frequency may be an upper cut-off frequency of the amplifier 120. Thus, the roll-off frequency may be greater than the roll-on frequency. In some embodiments, the amplifier 120 may have a roll-on frequency in the range of 10 to 100 MHz and a roll-off frequency in the range of 20 to 500 MHz.

In some embodiments, the second signal path 140 may comprise a second path comparator 168 configured to generate a digital output pulse 172 when the enable pulse 136 of the first signal path 116 is enabled and the voltage step 112 received from the CTIA pulse integrator 108 exceeds a second threshold, such as a threshold in the range of 5 mV to 50 mV (referred to the CTIA output). In some embodiments, the voltage step 112 may be passed through a series of high-pass amplifiers to yield a higher resolution voltage pulse 164 to be used as an input of the second path comparator 168.

The series of high-pass amplifiers may comprise any suitable number of amplifiers to yield a desired waveform. In some embodiments, the series of high-pass amplifiers may comprise a first amplifier 144 configured to generate a first waveform 148, a second amplifier 152 configured to generate a second waveform 156, and a third amplifier 160 configured to generate the higher resolution voltage pulse 164. In some embodiments, the amplifiers may have a larger bandwidth than the low-noise, high-pass amplifier 120 of the first signal path 116. In some embodiments, the amplifiers may have a roll-on frequency in the range of 50 to 500 MHz and a roll-off frequency in the range of 100 to 5000 MHz.

The relatively large bandwidth of the amplifiers of the second signal path 140 may allow more frequencies to pass thereby yielding a higher resolution signal. The larger bandwidth, however, may allow increased noise to pass and may potentially cause a false pulse to be detected. To prevent the false pulse from being transmitted as the output pulse 172, the second path comparator may generate the output pulse 172 only when the enable pulse 136 is enabled. That is, the first signal path 116 may be configured to detect a valid pulse and to apply time domain filtering to gate the second signal path 140 when the valid pulse is detected.

In some embodiments, the first signal path 116 may experience more signaling delay than the second signal path 140. For example, the smaller bandwidth of amplifier 120 may introduce more signaling delay than the amplifiers 144, 152, and 160. Accordingly, the amplifiers 144, 152, and 160 of the second signal path 140 may be selected to improve synchronization with the first signal path 116. For example, the third amplifier 160 may be configured to narrow a pulse width and to increase an amplitude of the voltage pulse so detection of a voltage peak occurs when a corresponding enable pulse 136 is enabled.

Figure 3:
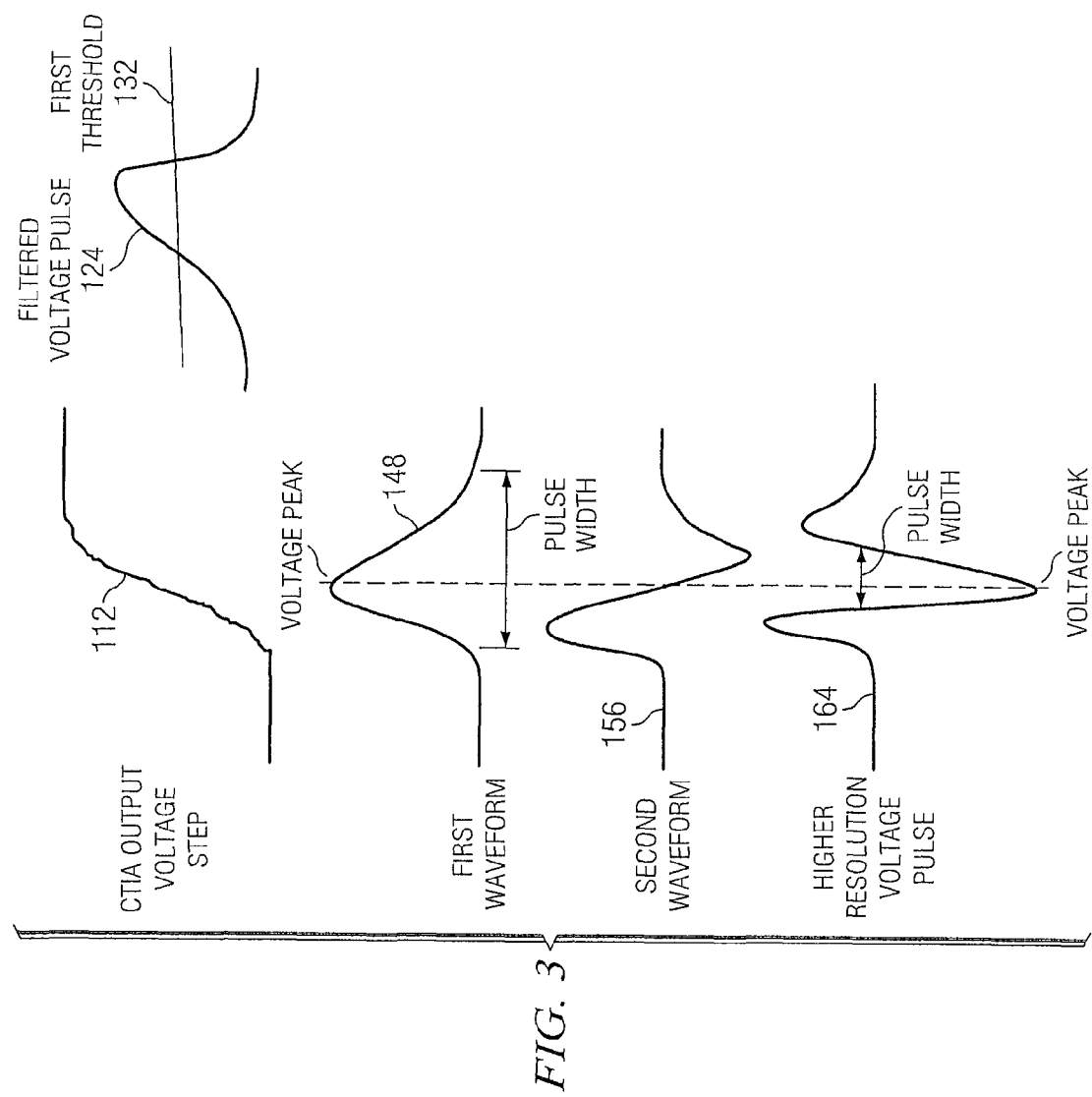
FIG. 3 illustrates examples of signals generated by the circuit of FIG. 2.

FIG. 3 illustrates an example of signals generated by the circuit of FIG. 2. In some embodiments, the voltage step 112 may be output from the CTIA pulse integrator 108 and may be directed to the first signal path 116 and the second signal path 140. The first signal path 116 may direct the voltage step 112 to the low-noise, high-pass amplifier 120 to yield filtered voltage step 124. The first path comparator 128 may enable the enable pulse 136 when the filtered voltage pulse 124 exceeds the first threshold 132.

The second signal path 140 may direct the voltage step 112 to the first amplifier 144 to yield the first waveform 148. The first waveform may be directed to the second amplifier 152 to yield the second waveform 156. The second waveform may be directed to the third amplifier 160 to yield the higher resolution voltage pulse 164. In some embodiments, the higher resolution voltage pulse 164 may have a narrower pulse width and a larger voltage peak than the first waveform 148 and the second waveform 156. In some embodiments, the higher resolution voltage pulse 164 may have an inverted peak.

Figure 4:
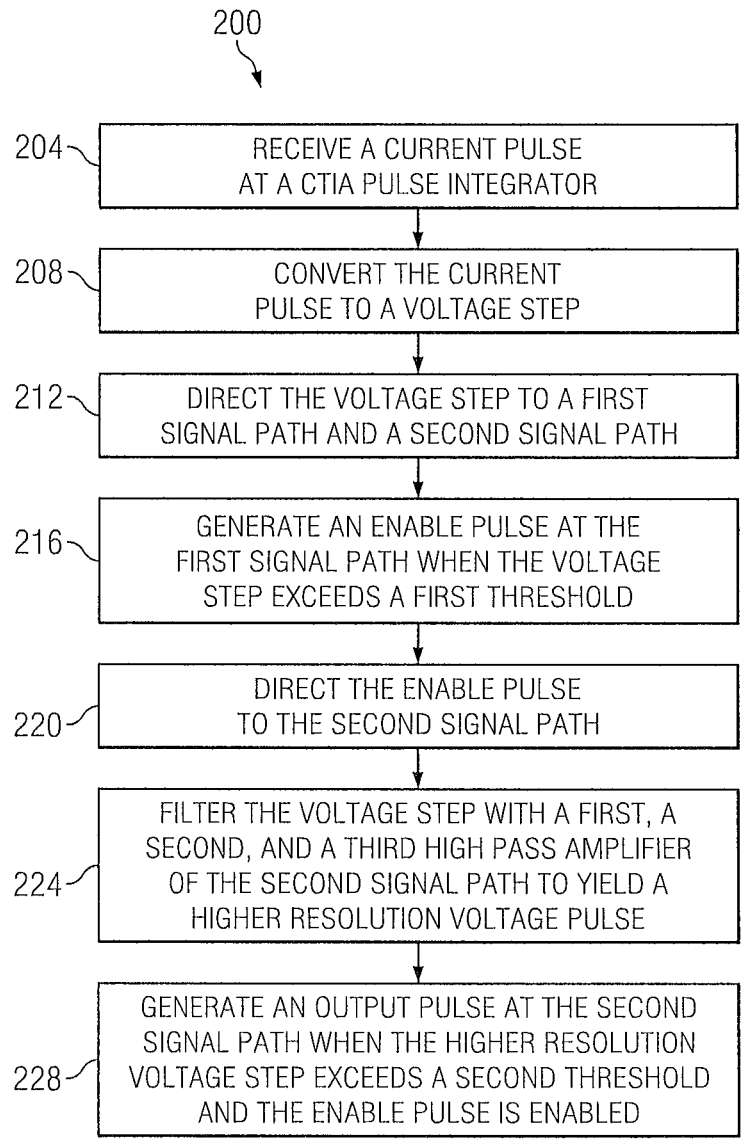
FIG. 4 illustrates an example of a method for generating an output pulse using a circuit comprising a CTIA and a high-pass amplifier.

FIG. 4 illustrates an example of a method 200 for generating an output pulse using a circuit comprising a CTIA pulse integrator and a high-pass amplifier. The method may begin at step 204 where a CTIA pulse integrator receives a current pulse. At step 208, the CTIA pulse integrator may convert the current pulse to a voltage step by integrating a charge of the current pulse.

The voltage step generated by the CTIA pulse integrator may be directed to a first signal path and a second signal path at step 212. The first signal path may generate an enable pulse at step 216 when the voltage step exceeds a first threshold. In some embodiments, the first signal path may be configured to minimize the likelihood of the detecting a false pulse. For example, the first threshold may be relatively high to prevent the first signal path from enabling the enable pulse due to the detection of noise, rather than the signal. At step 220, the enable pulse may be directed to the second signal path.

The second signal path may receive the voltage step from the CTIA pulse integrator and may filter the voltage step at step 224. In some embodiments, the second signal path may filter the voltage step with a first, a second, and a third high-pass amplifier to yield a higher resolution voltage pulse. For example, the first, second, and third amplifiers may have a relatively large bandwidth to allow lower frequencies, which may potentially be signal or noise, to pass. In some embodiments, passing the signal through the series of amplifiers may sharpen the waveform by narrowing the pulse width and/or increasing the peak amplitude. The sharpened waveform may allow for better detection of the voltage peak.

At step 228, the second signal path may generate a digital output pulse when the higher resolution voltage pulse exceeds a second threshold and the enable pulse is enabled. In some embodiments, the sharpened waveform received from the third amplifier of the second signal path may allow the peak of the higher resolution voltage pulse to be detected at substantially the same time that a corresponding enable pulse is enabled. Upon generation of the output voltage, the method ends.

Modifications, additions, or omissions may be made to the methods described without departing from the scope of the invention. The methods may include more, fewer, or other steps. Additionally, steps may be performed in any suitable order.

Figure 5:
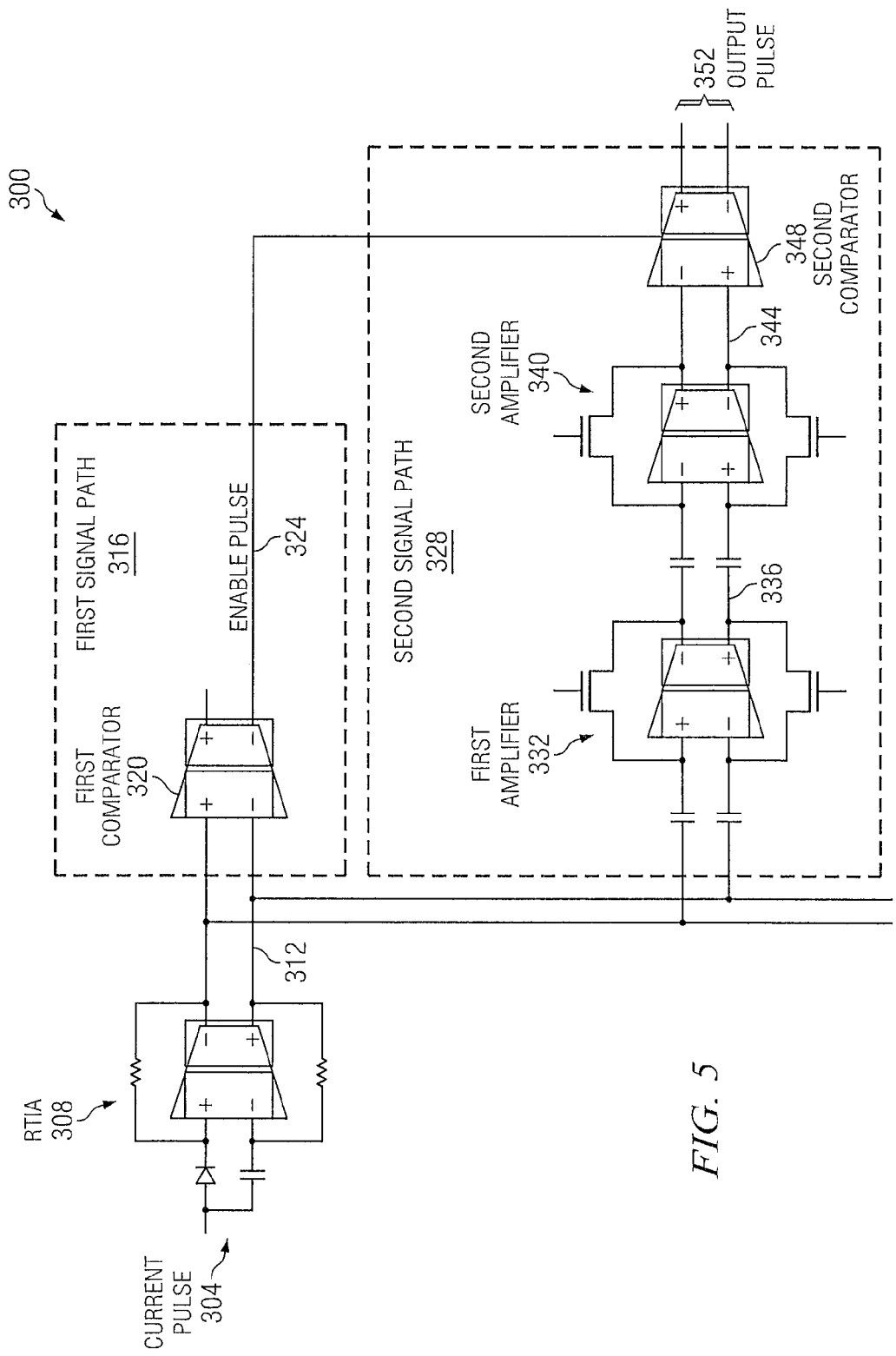
FIG. 5 illustrates an example of a circuit comprising a Resistive Trans-Impedance Amplifier (RTIA) and a high-pass amplifier.

FIG. 5 illustrates an example of a circuit 300 comprising a Resistive Trans-Impedance Amplifier (RTIA) 308 and a high-pass amplifier. In some embodiments, the circuit 300 may be used as the amplifier system 32 of FIG. 1.

In some embodiments, circuit 300 may receive an analog current pulse 304, such as a current pulse 304 generated by a sensor of a LADAR. The current pulse 304 may be received by the RTIA 308, where it may be converted to a voltage pulse 312. The voltage pulse 312 may be directed to a first signal path 316 and a second signal path 328.

In some embodiments, the first signal path 316 may generate an enable pulse 324 configured to enable the second signal path 328 to generate an output pulse 352. The first signal path 316 may comprise a first path comparator 320 configured to enable the enable pulse 352 when the voltage pulse 312 exceeds a first threshold. In some embodiments, the first threshold may be relatively high to minimize detection of a false pulse by the first path comparator 320. For example, the first path threshold may be in the range of 5 mV to 500 mV.

In some embodiments, the second signal path 328 may comprise a second path comparator 348 configured to generate the digital output pulse 352 when the enable pulse 324 of the first signal path 316 is enabled and the voltage pulse 312 received from the RTIA 308 exceeds a second threshold, such as a threshold in the range of 10 mV to 1000 mV (referred to the RTIA output). In some embodiments, the voltage pulse 312 may be passed through a series of high-pass amplifiers to yield a higher resolution voltage pulse 344 to be used as an input of the second path comparator 348.

The series of high-pass amplifiers may comprise any suitable number of amplifiers to yield a desired waveform. In some embodiments, the series of high-pass amplifiers may comprise a first amplifier 332 configured to generate a first waveform 336 and a second amplifier 340 configured to generate the higher resolution voltage pulse 344. In some embodiments, the amplifiers may have a relatively large bandwidth thereby allowing more frequencies to pass to yield a higher resolution signal. In some embodiments, the amplifiers may have a roll-on frequency in the range of 50 to 500 MHz and a roll-off frequency in the range of 100 to 5000 MHz. The relatively large bandwidth, however, may allow increased noise to pass and may potentially cause a false pulse to be detected. To prevent the false pulse from being transmitted as the output pulse 352, the second path comparator may generate the output pulse 352 only when the enable pulse 324 is enabled. That is, the first signal path 316 may be configured to detect a valid pulse and to apply time domain filtering to gate the second signal path 328 when the valid pulse is detected.

In some embodiments, the signal delay of the first signal path 316 may be different from the signal delay of the second signal path 328. The amplifiers 332 and 340 of the second signal path 328 may be selected to improve synchronization with the first signal path 316. For example, the second amplifier 340 may be configured to narrow a pulse width and to increase an amplitude of the higher resolution voltage pulse 344 so detection of a voltage peak occurs when a corresponding enable pulse 324 is enabled.

Figure 6:
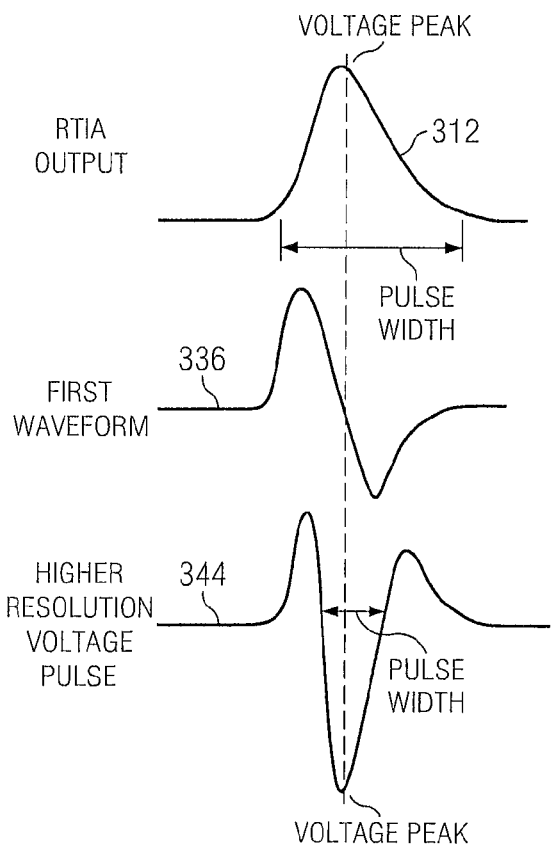
FIG. 6 illustrates examples of signals generated by the circuit of FIG. 5.

FIG. 6 illustrates an example of signals generated by the circuit of FIG. 5. In some embodiments, the voltage pulse 312 may be output from the RTIA 308 and may be directed to the first signal path 316 and the second signal path 328. The first signal path 316 may direct the voltage step 312 to the first path comparator 320 to enable the enable pulse 324 when the first threshold is exceeded.

The second signal path 328 may direct the voltage pulse 312 to the first amplifier 332 to yield the first waveform 336. The first waveform may be directed to the second amplifier 340 to yield the higher resolution voltage pulse 344. In some embodiments, the higher resolution voltage pulse 344 may have a narrower pulse width and a larger voltage peak than the first waveform 336. In some embodiments, the higher resolution voltage pulse 344 may have an inverted peak.

Figure 7:
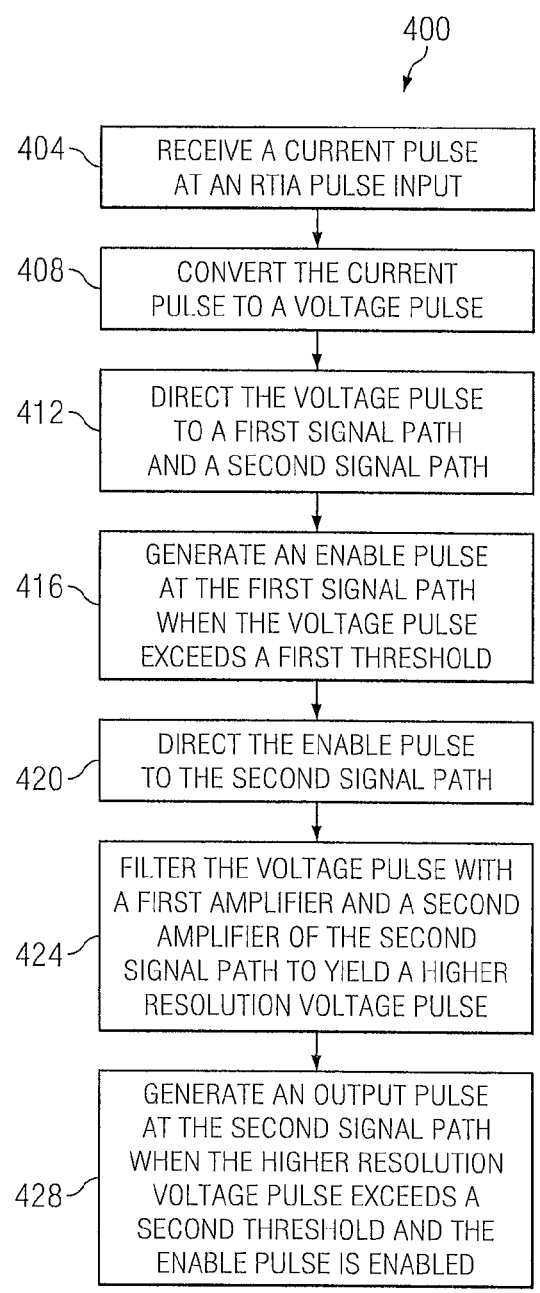
FIG. 7 illustrates an example of a method for generating an output pulse using a circuit comprising an RTIA and a high-pass amplifier.

FIG. 7 illustrates an example of a method 400 for generating an output pulse using a circuit comprising an RTIA and a high-pass amplifier. The method may begin at step 404 where an RTIA receives a current pulse. At step 408, the RTIA may convert the current pulse to a voltage pulse.

The voltage pulse generated by the RTIA may be directed to a first signal path and a second signal path at step 412. The first signal path may generate an enable pulse at step 416 when the voltage step exceeds a first threshold. In some embodiments, the first signal path may be configured to minimize the likelihood of the detecting a false pulse. For example, the first threshold may be relatively high to prevent the first signal path from enabling the enable pulse due to the detection of noise, rather than the signal. At step 420, the enable pulse may be directed to the second signal path.

The second signal path may receive the voltage pulse from the RTIA and may filter the voltage pulse at step 424. In some embodiments, the second signal path may filter the voltage step with a first and a second high-pass amplifier to yield a higher resolution voltage pulse. For example, the first and second amplifiers may have a relatively wide bandwidth to allow lower frequencies, which may potentially be signal or noise, to pass. In some embodiments, passing the signal through the series of amplifiers may sharpen the waveform by narrowing the pulse width and/or increasing the peak amplitude. The sharpened waveform may allow for better detection of the voltage peak.

At step 428, the second signal path may generate a digital output voltage when the higher resolution voltage pulse exceeds a second threshold and the enable pulse is enabled. In some embodiments, the sharpened waveform output by the second amplifier of the second signal path may allow the peak to be detected at substantially the same time that a corresponding enable pulse is enabled. The method then ends.

Modifications, additions, or omissions may be made to the methods described without departing from the scope of the invention. The methods may include more, fewer, or other steps. Additionally, steps may be performed in any suitable order.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the following claims.

The invention claimed is:

1. A circuit comprising:
a Resistive Trans-Impedance Amplifier (RTIA) configured to:
  receive a current pulse at an input; and
  convert the current pulse to a voltage pulse;
a first signal path configured to:
  receive the voltage pulse from the RTLA; and
  generate an enable pulse when the voltage pulse exceeds a first threshold; and
a second signal path configured to:
  receive the voltage pulse from the RTIA;
  receive the enable pulse from the first signal path; and
  generate an output pulse when the voltage pulse exceeds a second threshold and the enable pulse is enabled; and
the second signal path comprising a first and a second high-pass amplifier configured to increase detection of the voltage pulse.

2. The circuit of claim 1, the first signal path further comprising:
a first path comparator configured to enable the enable pulse when the voltage pulse exceeds the first threshold, the first threshold selected to minimize detection of a false pulse by the first path comparator.

3. The circuit of claim 1, the second signal path further comprising:
a second path comparator configured to generate the output pulse when the voltage pulse exceeds the second threshold and the enable pulse is enabled.

4. The circuit of claim 1, the second amplifier configured to narrow a pulse width of the voltage pulse to increase detection of a voltage peak.

5. The circuit of claim 1, the current pulse input received from a sensor of a Laser Detection and Ranging (LADAR) system, the sensor configured to detect a laser pulse reflected by a target object.

6. A method comprising:
receiving a current pulse at an input of a Resistive Trans-Impedance (RTIA) amplifier;
converting the current puke to a voltage pulse;
directing the voltage pulse to a first signal path and a second signal path;
receiving the voltage pulse at the first signal path;
generating, by the first signal path, an enable pulse when the voltage pulse exceeds a first threshold;
directing the enable pulse to a second signal path;
receiving the voltage pulse and the enable pulse at the second signal path; and
generating, by the second signal path, an output pulse when the voltage pulse exceeds a second threshold and the enable pulse is enabled, the second signal path comprising a first and a second amplifier to increase detection of the voltage pulse.

7. The method of claim 6, the generating the enable pulse further comprising:
enabling the enable pulse when the filtered voltage pulse exceeds the first threshold at a first path comparator, the first threshold selected to minimize detection of a false pulse by the first path comparator.

8. The method of claim 6, the generating the output pulse further comprising:
determining, by a second path comparator, when the voltage puke exceeds the second threshold and the enable pulse is enabled.

9. The method of claim 6, the second amplifier further configured to perform the step of:
narrowing a pulse width of the voltage pulse to increase detection of a voltage peak.

10. The method of claim 6, the receiving the current pulse further comprising:
receiving the current pulse from a sensor of a Laser Detection and Ranging (LADAR) system, the sensor configured to detect a laser pulse reflected by a target object.

* * * * *